(12) United States Patent
Saito (10) Patent No.: US 6,936,108 B1
(45) Date of Patent: Aug. 30, 2005

(54) HEAT TREATMENT DEVICE

(75) Inventor: Yukimasa Saito, Shiroyama-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 59 days.

(21) Appl. No.: 10/129,661

(22) PCT Filed: Nov. 9, 2000

(86) PCT No.: PCT/JP00/07886

§ 371 (c)(1),
(2), (4) Date: May 9, 2002

(87) PCT Pub. No.: WO01/35453

PCT Pub. Date: May 17, 2001

(30) Foreign Application Priority Data

Nov. 9, 1999 (JP) .................................. 11-317929
Jun. 20, 2000 (JP) ............................. 2000-184309

(51) Int. Cl.[7] ...................... C23C 16/00; C23C 16/455; F27D 7/00
(52) U.S. Cl. ....................... 118/715; 118/724; 118/725; 156/345.29; 432/241
(58) Field of Search ....................... 118/724, 725, 715; 156/345.29; 432/241

(56) References Cited

U.S. PATENT DOCUMENTS

| | | | | |
|---|---|---|---|---|
| 4,674,443 A | * | 6/1987 | Furukawa et al. ........... | 118/733 |
| 5,359,148 A | * | 10/1994 | Okase et al. ................. | 118/724 |
| 5,415,585 A | * | 5/1995 | Miyagi ........................ | 454/187 |
| 5,421,894 A | * | 6/1995 | Lei et al. .................... | 118/725 |
| 5,433,784 A | * | 7/1995 | Miyagi et al. ............... | 118/715 |
| 5,445,521 A | * | 8/1995 | Yamaguchi et al. ........... | 432/5 |
| 5,484,484 A | | 1/1996 | Yamaga et al. ............. | 118/719 |
| 5,567,149 A | * | 10/1996 | Hansotte et al. ............... | 432/6 |
| 5,575,853 A | * | 11/1996 | Arami et al. ................ | 118/708 |
| 5,578,132 A | * | 11/1996 | Yamaga et al. ............. | 118/724 |

(Continued)

FOREIGN PATENT DOCUMENTS

EP 1 069 597 1/2001

(Continued)

OTHER PUBLICATIONS

PCT Notification of Transmittal of Copies of Translation of the International Preliminary Examination Report (PCT/IB/338) issued for PCT/JP00/07886.

(Continued)

*Primary Examiner*—Jeffrie R. Lund
(74) *Attorney, Agent, or Firm*—Smith, Gambrell & Russell, LLP (57) ABSTRACT

A film-forming unit of the invention includes: a processing furnace, gas-supplying means that supplies a process gas into the processing furnace, heating means that heats an inside of the processing furnace to a predetermined process-temperature, and a normal-pressure gas-discharging system for discharging gas from the processing furnace at a predetermined discharging-pressure that is near to an atmospheric pressure. A valve is provided in the normal-pressure gas-discharging system, the valve being adjustably caused to open and close, a pressure of the gas through the valve being also adjustable. A pressure sensor detects a discharging-pressure in the normal-pressure gas-discharging system. A controller controls the valve based on the pressure detected by the pressure sensor. According to the feature, a stable control can be achieved without necessity of introducing atmospheric air or introducing any inert gas. In addition, a structure of the gas-discharging system is simplified, and reduction of costs for the whole unit is achieved.

1 Claim, 3 Drawing Sheets

U.S. PATENT DOCUMENTS

| | | | |
|---|---|---|---|
| 5,750,436 A | 5/1998 | Yamaga et al. | 438/558 |
| 5,777,300 A * | 7/1998 | Homma et al. | 219/679 |
| 5,851,293 A | 12/1998 | Lane et al. | 118/715 |
| 5,888,579 A * | 3/1999 | Lun | 427/8 |
| 6,106,626 A * | 8/2000 | Guan et al. | 118/715 |
| 6,139,642 A * | 10/2000 | Shimahara et al. | 118/724 |
| 6,159,298 A * | 12/2000 | Saito | 118/715 |
| 6,165,272 A * | 12/2000 | Liu | 118/715 |
| 6,251,169 B1 * | 6/2001 | Shimomura et al. | 95/284 |
| 6,287,984 B1 | 9/2001 | Horie | 438/758 |
| 6,578,600 B1 * | 6/2003 | Young, Jr. | 137/377 |
| 2001/0029889 A1 * | 10/2001 | Holcomb et al. | 118/715 |
| 2002/0020433 A1 * | 2/2002 | Suemura et al. | 134/2 |
| 2003/0127052 A1 * | 7/2003 | Kim et al. | 118/715 |
| 2003/0170949 A1 * | 9/2003 | Chouno et al. | 438/200 |
| 2004/0002224 A1 * | 1/2004 | Chono et al. | 438/714 |
| 2004/0069226 A1 * | 4/2004 | Yoshida et al. | 118/715 |
| 2004/0110106 A1 * | 6/2004 | Mokuo | 432/5 |
| 2004/0175666 A1 * | 9/2004 | Saito | 432/72 |

FOREIGN PATENT DOCUMENTS

| | | | |
|---|---|---|---|
| JP | 63-17520 | * | 1/1988 |
| JP | 63-210501 | | 9/1988 |
| JP | 6-26248 | | 4/1994 |
| JP | 7-58032 | | 3/1995 |
| JP | 8-139085 | | 5/1996 |
| JP | 11-233505 | | 8/1999 |

OTHER PUBLICATIONS

International Preliminary Examination Report (PCT/IPEA/409) (translated) issued for PCT/JP00/07886.

International Search Report mailed Feb. 13, 2002 (PCT/JP00/07888).

* cited by examiner

HEAT TREATMENT DEVICE

FIELD OF THE INVENTION

This invention relates to a thermal processing unit.

BACKGROUND OF THE INVENTION

For example, in a manufacturing process of a semiconductor device, as a thermal processing, there is an oxidation step wherein an oxide film is formed on a surface of a semiconductor wafer, which is an object to be processed. As a method for the oxidation treatment, there is a method to bring a semiconductor wafer into contact with water vapor at a predetermined process temperature and thus to oxidize the same (wet oxidization). In order to carry out the method, there is known an oxidation processing unit (a thermal processing unit) wherein a burning unit that causes hydrogen gas and oxygen gas to react (burn) to generate water vapor is independently arranged outside a processing furnace, and wherein the water vapor generated by the burning unit is supplied into the processing furnace to carry out a heat treatment, as shown in JP Laid-Open Publication No. 63-210501 or the like.

In addition, as a thermal processing unit, there are a normal-pressure type of unit having a normal-pressure gas-discharging system and another type of unit, by which a treatment can be carried out under a reduced pressure, having a normal-pressure gas-discharging system and a reduced-pressure gas-discharging system.

In a conventional normal-pressure type of thermal processing unit, a discharging-pressure-controlling valve, which is a butterfly-valve type or another type of adjusting its own opening degree via a stepping motor and a spring, and a differential-pressure type of pressure sensor are provided in a normal-pressure gas-discharging system that discharges inside gas from a processing furnace at a predetermined discharging-pressure, in order to control the discharging-pressure.

On the other hand, in a conventional reduced-pressure type of thermal processing unit, by which a treatment can be carried out under a reduced pressure, a gas-discharging system from a processing furnace branches into a normal-pressure gas-discharging system and a reduced-pressure gas-discharging system. A switching valve is provided at the branching portion, and the discharging-pressure-controlling valve and the pressure sensor, which are described above, are provided in the normal-pressure gas-discharging system in order to control the discharging-pressure. In addition, a combination valve and a pressure sensor are provided in the reduced-pressure gas-discharging system in order to carry out a reduced-pressure control.

However, in both the normal-pressure type of thermal processing unit and the reduced-pressure type of thermal processing unit, if the discharging-pressure-controlling valve is a butterfly-valve type, the water vapor may condense to generate a water screen between the valve and a pipe, which may make the control unstable. Thus, in order to avoid the above disadvantage, it was necessary to provide atmospheric-air-introducing ports on the front side and the rear side of the valve. In addition, if the discharging-pressure-controlling valve is another type of valve which adjusts its own opening degree via a stepping motor and a spring, in order to make the motion of the valve smooth and hence to make the control performance stable, it was necessary to introduce an inert gas such as $N_2$ gas toward the valve. Thus, running-costs for the inert gas were necessary.

In addition, in the reduced-pressure type of thermal processing unit, the switching valve is necessary, which leads to structural complication.

SUMMARY OF THE INVENTION

This invention is intended to solve the above problems. The object of this invention is to provide a thermal processing unit wherein a stable control can be achieved without necessity of introducing atmospheric air or introducing any inert gas, wherein a structure of the gas-discharging system is simplified, and wherein reduction of costs is achieved.

A thermal processing unit of the invention has a feature that the thermal processing unit comprises: a processing furnace; gas-supplying means that supplies a process gas into the processing furnace; heating means that heats an inside of the processing furnace to a predetermined process-temperature; a normal-pressure gas-discharging system for discharging gas from the processing furnace at a predetermined discharging-pressure that is near to an atmospheric pressure; a valve provided in the normal-pressure gas-discharging system, the valve being adjustably caused to open and close, a pressure of the gas through the valve being also adjustable; a pressure sensor that detects a discharging-pressure in the normal-pressure gas-discharging system; and a controller that controls the valve based on the pressure detected by the pressure sensor.

According to the feature, a stable control can be achieved without necessity of introducing atmospheric air or introducing any inert gas. In addition, a structure of the gas-discharging system is simplified, and reduction of costs for the whole unit is achieved.

The pressure sensor may be differential-pressure type or absolute-pressure type. If the pressure sensor is the latter, a stable control can be achieved without disturbance caused by change in the atmospheric pressure. That is, an oxide film having a uniform film-thickness can be formed at any time.

In addition, a thermal processing unit of the invention has a feature that the thermal processing unit comprises: a processing furnace; gas-supplying means that supplies a process gas into the processing furnace; heating means that heats an inside of the processing furnace to a predetermined process-temperature; a normal-pressure gas-discharging system for discharging gas from the processing furnace at a predetermined discharging-pressure that is near to an atmospheric pressure; a first valve provided in the normal-pressure gas-discharging system, the valve being adjustably caused to open and close, a pressure of the gas through the valve being also adjustable; a first pressure sensor that detects a discharging-pressure in the normal-pressure gas-discharging system; a reduced-pressure gas-discharging system for discharging gas from the processing furnace at another predetermined discharging-pressure that is lower than the atmospheric pressure; a second valve provided in the reduced-pressure gas-discharging system, the valve being adjustably caused to open and close, a pressure of the gas through the valve being also adjustable; a second pressure sensor that detects a discharging-pressure in the reduced-pressure gas-discharging system; and a controller that controls the first valve based on the pressure detected by the first pressure sensor and that controls the second valve based on the pressure detected by the second pressure sensor.

According to the feature, a stable control can be achieved without necessity of introducing atmospheric air or introducing any inert gas. In addition, the switching valve becomes unnecessary, and hence a structure of the gas-discharging system is simplified, and reduction of costs for the whole unit is achieved.

The first pressure sensor may be differential-pressure type or absolute-pressure type. Similarly, the second pressure sensor may be differential-pressure type or absolute-pressure type. If an absolute-pressure type of pressure sensor is used, a stable control can be achieved without disturbance caused by change in the atmospheric pressure. That is, an oxide film having a uniform film-thickness can be formed at any time.

In addition, a thermal processing unit of the invention has a feature that the thermal processing unit comprises: a processing furnace; gas-supplying means that supplies a process gas into the processing furnace; heating means that heats an inside of the processing furnace to a predetermined process-temperature; a normal-pressure gas-discharging system for discharging gas from the processing furnace at a predetermined discharging-pressure that is near to an atmospheric pressure; a valve provided in the normal-pressure gas-discharging system, the valve being adjustably caused to open and close, a pressure of the gas through the valve being also adjustable; an absolute-pressure type of pressure sensor that detects an atmospheric pressure as an absolute pressure; a differential-pressure type of pressure sensor that detects a discharging-pressure in the normal-pressure gas-discharging system as a differential pressure with respect to the atmospheric pressure; and a controller that controls the valve based on the pressure detected by the differential-pressure type of pressure sensor in such a manner that the discharging-pressure in the normal-pressure gas-discharging system coincides with a set differential pressure, and that amends the set differential pressure based on the pressure detected by the absolute-pressure type of pressure sensor.

According to the feature, a stable control can be achieved without disturbance caused by change in the atmospheric pressure, even by a differential-pressure control. That is, an oxide film having a uniform film-thickness can be formed at any time.

DESCRIPTION OF THE PREFERRED EMBODIMENT

Embodiments of the invention are explained in detail based on attached drawings.

Figure 1:
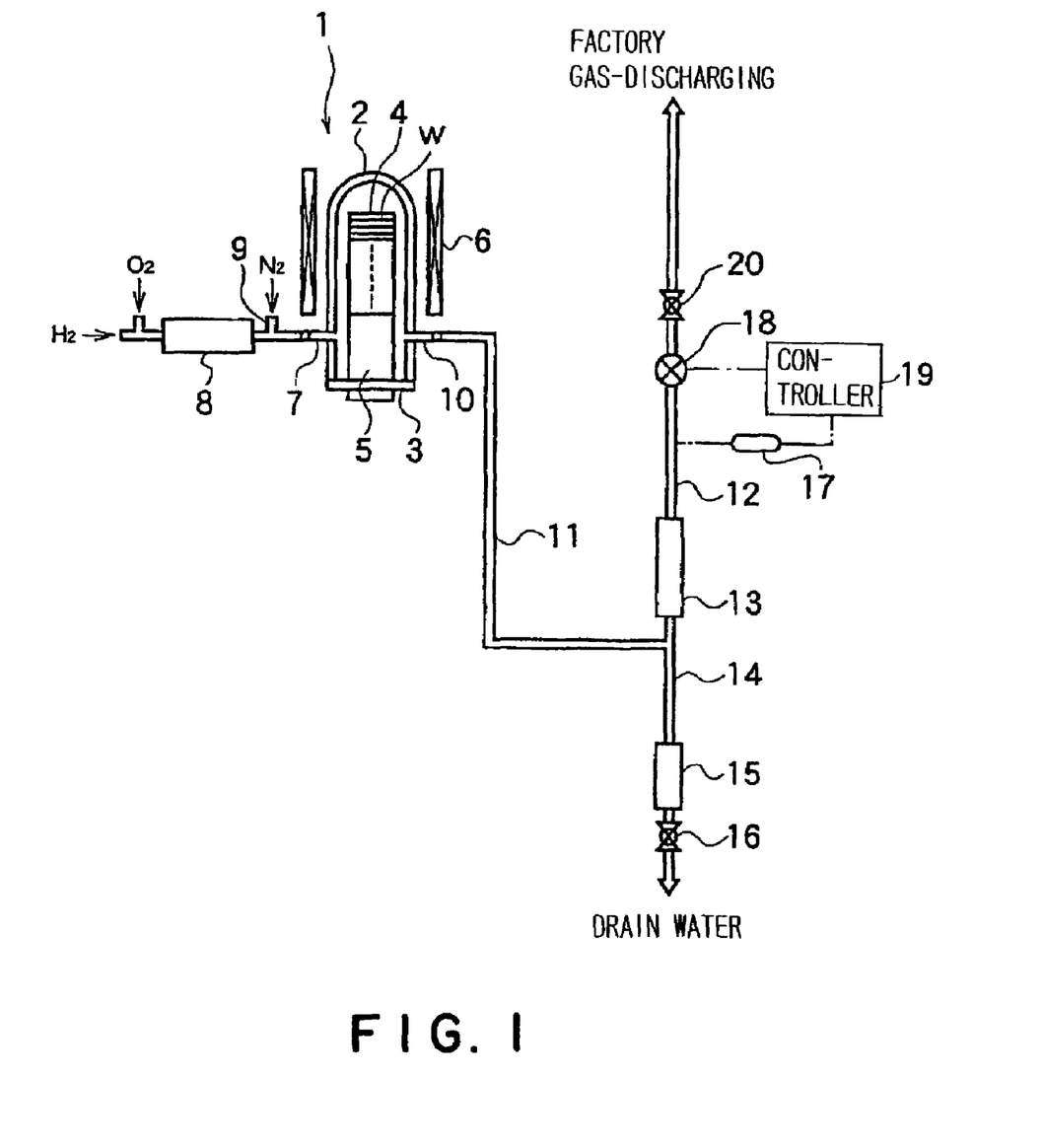
FIG. 1 is a structural view showing an oxidation treatment unit of a first embodiment according to the invention.

FIG. 1 is a view showing a structure of an oxidation treatment unit of a first embodiment according to the invention. The oxidation treatment unit (a thermal processing unit) of the embodiment is formed as a normal-pressure type of unit. In FIG. 1, a processing furnace 1, which is vertical and batch type, is adapted to contain semiconductor wafers W as objects to be processed, and to conduct a heat treatment to the semiconductor wafers W at a high temperature such as about 850° C. while water vapor as a process gas is supplied thereinto. The processing furnace 1 has a reaction tube (processing container) 2, whose upper end is closed, whose lower end is open, which has a longitudinal cylindrical shape and a heat resistance, and which is made of for example quartz.

The reaction tube 2 is adapted to form the processing furnace 1 with a high airtightness when an opening at a lower end thereof as a furnace opening is hermetically closed by a lid 3. A wafer-boat 4, which is made of for example quartz, as a substrate holder for holding many, for example about 150 horizontal semiconductor wafers W in a vertical tier-like manner at intervals, is placed on the lid via a heat insulating cylinder 5.

The lid 3 is adapted to load (convey) the wafer boat 4 into the processing furnace 1, unload (convey) the wafer boat 4 from the processing furnace 1, and open and close the furnace opening, by means of an elevating mechanism not shown. A heater 6 that can heat and control the inside of the processing furnace to a predetermined temperature, for example 300 to 1000° C., is provided around the reaction tube 2. A suitable number of gas-introducing pipes 7 is provided at a lower portion of the reaction tube 2. One of the gas-introducing pipes 7 is connected to a burning unit 8 that generates water vapor by a burning reaction between hydrogen gas $H_2$ and oxygen gas $O_2$ and that supplies the water vapor as process-gas supplying means (water-vapor supplying means).

Preferably, the burning unit 8 is formed to be able to supply the water vapor at a minute flow rate, for example of 0.4 to 1 liter per minute (3 liter or more per minute according to prior art), by reducing the aperture of a burning nozzle or improving the shape of the burning nozzle or the like. In addition, an inert-gas supplying part 9 that supplies an inert gas such as nitrogen gas $N_2$ is provided in the burning unit 8, in order to dilute the water vapor. The others of the gas-introducing pipes 7 are respectively connected to gas sources that supply other process gases such as nitrogen oxide gas NO, dinitrogen oxide gas $N_2O$ and hydrogen chloride gas HCl, or inert gas such as $N_2$ (omitted in the drawings).

A gas-discharging part 10 is provided at a lower side wall of the reaction tube 2 for discharging gas present inside the reaction tube 2. The gas-discharging part 10 is connected to a normal-pressure gas-discharging system 12 via a gas-discharging pipe 11 that extends to a lower position with respect to the processing furnace 1. The normal-pressure gas-discharging system 12 extends upward from the joining part with the gas-discharging pipe 11 (located lower than the processing furnace 1) in the shown example, and is connected to a factory gas-discharging system including a harm-removing unit and/or a gas-discharging blower not shown. Thus, the gas in the reaction tube 2 can be discharged therefrom at a predetermined discharging-pressure. The normal-pressure gas-discharging system 12 may extend downward from the joining part.

A condenser 13 for cooling the discharged water vapor and causing the same to condense is provided in the normal-pressure gas-discharging system 12. Drain water generated by the water vapor being caused to condense by the condenser 13 is adapted to be drained off via a drain pipe 14, which extends downward from the joining part with the gas-discharging pipe 11, a trap 15 and a ball valve 16. The gas-discharging pipe 11 and the normal-pressure gas-discharging system 12 are made of a corrosion-resistance material such as quartz, stainless steel, preferably PTFE (polytetrafluoroethylene, the trade name is Teflon).

A pressure sensor 17 and a combination valve 18, which is adjustably caused to open and close and whose pressure is also adjustable, are provided in order in the normal-pressure gas-discharging system 12 on a downstream (upper) side with respect to the condenser 13. For example, the combination valve 18 may convert an electric signal into an air pressure, in order to control the position of a valve body (not shown). In addition, the combination valve 18 has an O-shaped ring (not shown) at a seating portion for the valve body, so that the combination valve 18 can shut off. The combination valve 18 is made of a corrosion-resistance material such as PTFE.

As the pressure sensor 17, a differential-pressure type of pressure sensor or an absolute-pressure type of pressure sensor may be used. As the differential-pressure type of pressure sensor, a pressure sensor that can detect a pressure within a range of atmospheric pressure (1013.25 hPa)±1330 Pa may be used. Alternatively, as the absolute-pressure type of pressure sensor, a pressure sensor that can detect a pressure within a range of 800 hPa to 1100 hPa may be used. The combination valve 18 is adapted to be controlled by a controlling part (controller) 19, based on a pressure detected by the pressure sensor 17. Thus, the heat treatment can be carried out while the discharging-pressure is controlled at a minute differential pressure of about −50 Pa to −100 Pa with respect to the atmospheric pressure. In addition, a ball valve 20 is provided in the normal-pressure gas-discharging system 12 at a downstream portion with respect to the combination valve 18. Thus, the embodiment can cope with a situation wherein suction force of the factory gas-discharging system is strong (for example as strong as about −1000 Pa).

The normal-pressure type of oxidation treatment unit having the above structure is for supplying the process gas into the processing furnace 1 that contains the semiconductor wafers W and for thermally processing the semiconductor wafers W at a predetermined process temperature. Then, the normal-pressure type of oxidation treatment unit has: the normal-pressure gas-discharging system 12 for discharging the gas from the processing furnace 1 at a predetermined discharging-pressure; the combination valve 18 provided in the normal-pressure gas-discharging system 12 and adjustably caused to open and close, the pressure of the gas through the valve 18 being also adjustable; the differential-pressure type or absolute-pressure type of pressure sensor 17 that detects the discharging-pressure; and the controller 19 that controls the combination valve 18 based on the pressure detected by the pressure sensor 17. Thus, a stable control can be achieved without necessity of introducing atmospheric air or introducing any inert gas, differently from the conventional normal-pressure type of thermal processing unit. In addition, the structure of the gas-discharging system is simplified, and running-costs for the inert gas such as $N_2$ becomes unnecessary, so that reduction of costs for the whole unit is achieved.

Especially, if an absolute-pressure type of pressure sensor 17 is used, a stable absolute-pressure control can be achieved in a vicinity of the atmospheric pressure, without disturbance that may be caused by change in the atmospheric pressure based on the meteorological condition. Thus, an oxide film having a uniform film-thickness can be formed at any time. In addition, in the above thermal processing unit, it is unnecessary to introduce atmospheric air or any inert gas on the front side and the rear side of the combination valve of the normal-pressure gas-discharging system. However, the thermal processing unit can be formed in such a manner that atmospheric air or any inert gas can be introduced thereon.

Figure 2:
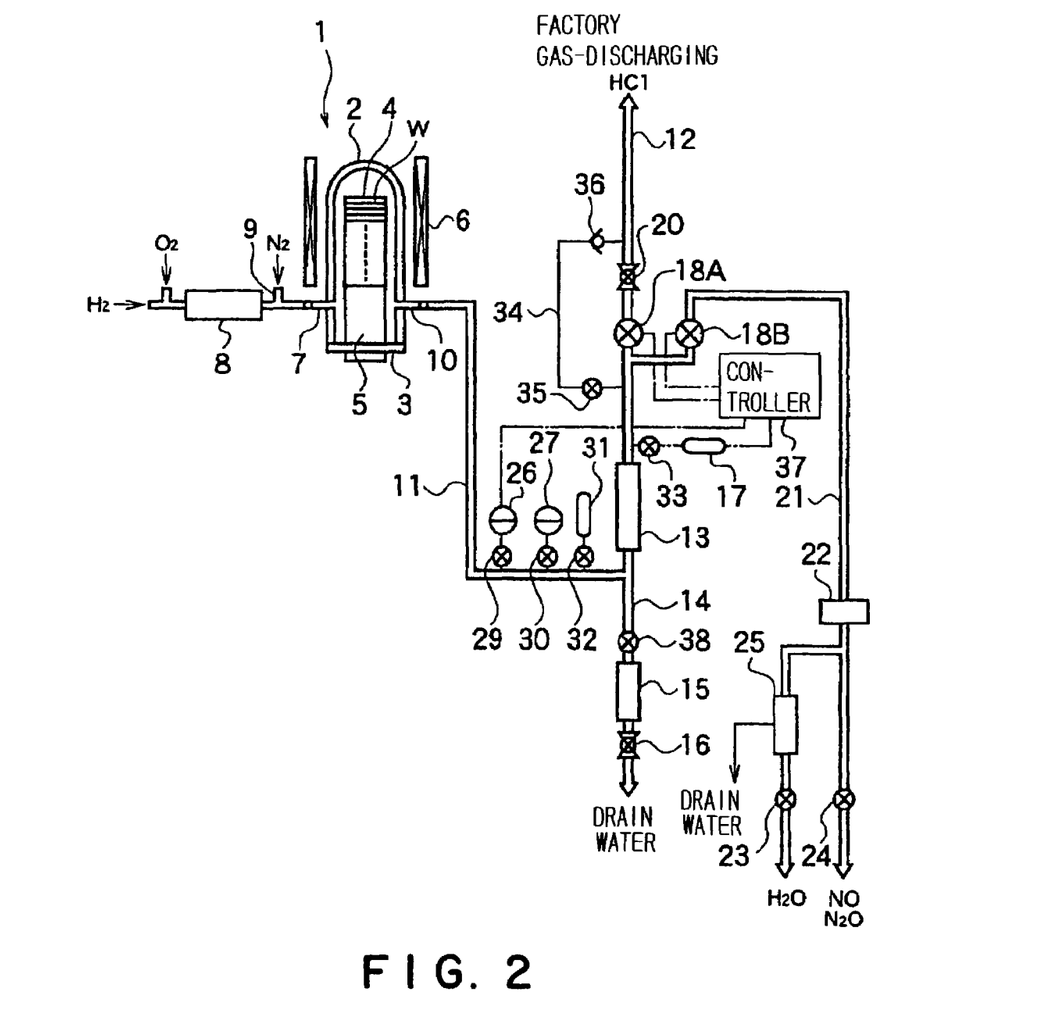
FIG. 2 is a structural view showing an oxidation treatment unit of a second embodiment according to the invention.

FIG. 2 is a view showing a structure of an oxidation treatment unit of a second embodiment according to the invention. The oxidation treatment unit (a thermal processing unit) of the embodiment is formed as a reduced-pressure type of unit, by which a treatment can be carried out under a reduced pressure. In the second embodiment, the same numeral references correspond to the same parts as the first embodiment. The explanation of the same parts is omitted.

The oxidation treatment unit of the embodiment includes the normal-pressure gas-discharging system 12 and a reduced-pressure gas-discharging system 21. The gas-discharging part 10 of the reaction tube 2 that forms the processing furnace 1 is connected to the normal-pressure gas-discharging system 12 via the gas-discharging pipe 11. The reduced-pressure gas-discharging system 21 branches off on the way of the normal-pressure gas-discharging system 12. In the normal-pressure gas-discharging system 12 and the reduced-pressure gas-discharging system 21 at the respective downstream portions with respect to the branching portion, combination valves 18A and 18B, which are adjustably caused to open and close and whose pressures are also adjustable, are provided respectively.

The reduced-pressure gas-discharging system 21 has a vacuum pump (pressure-reducing pump) 22 that can create a vacuum of for example about −1 Pa at the maximum in the processing furnace 1. Preferably, the vacuum pump is a dry-sealed vacuum pump. In the reduced-pressure gas-discharging system 21 at a downstream portion with respect to the vacuum pump 22, air-pressure-control type of switching valves 23 and 24 are provided for switching between a gas-discharging way for the time when the water vapor $H_2O$ is used and another gas-discharging way for the time when the nitrogen oxide gas NO and/or the dinitrogen oxide gas $N_2O$ are used. Moisture (drain water) in the gas discharged from the thermal processing system is removed by a trap 25. The discharged gas is processed by a harm-removing unit (not shown). The reduced-pressure gas-discharging system 21 is made of a corrosion-resistance material such as stainless steel, preferably PTFE.

For the gas-discharging pipe 11, a pressure sensor 26 that detects a gas-discharging pressure while a treatment is carried out under a reduced pressure (while the gas is discharged under a reduced pressure) and a pressure sensor 27 for a monitor and for a control are provided via air-pressure-control type of valves 29 and 30, respectively. For example, the pressure sensor 26 can detect a pressure within a range of 0 to 133 kPa. For example, the pressure sensor 27 can detect a pressure within a range of 0 to 1.33 kPa. As the pressure sensors 26 and 27, absolute-pressure type of pressure sensors may be used. A pressure switch (normal-pressure returning switch) 31, which is turned on when the gas-discharging pressure becomes a normal pressure or a positive pressure, is provided for the discharging pipe 11 via an air-pressure-control type of valve 32.

Between the condenser 13 and the combination valve 18A of the normal-pressure gas-discharging system 12, the pressure sensor 17 that detects a gas-discharging pressure while a treatment is carried out under a normal pressure (while the gas is discharged under a normal pressure) is provided via an air-pressure-control type of valve 33. The valve 33 is caused to open at an operation under a normal pressure and close at an operation under a reduced pressure, in order to prevent damage of the pressure sensor 17. As the pressure sensor 17, similarly to the above embodiment, a differential-pressure type of pressure sensor or an absolute-pressure type of pressure sensor may be used.

A bypass pipe 34 that bypasses the combination valve 18A and the ball valve 20 is connected to the normal-pressure gas-discharging system 12. A bypass valve 35 and a check valve 36, which are usually closed, are provided in the bypass pipe 34. The bypass valve 35 and the check valve 36 are caused to open in case of emergency, for example when a positive pressure is generated during an operation under a reduced pressure, or when a power failure happens.

The combination valves 18A and 18B, which are provided in the normal-pressure gas-discharging system 12 and in the reduced-pressure gas-discharging system 21, respectively, are adapted to be controlled by the common controlling part (controller) 37, based on the pressures detected by the pressure sensors 17, 26 and 27. In detail, for an operation under a normal pressure, the controlling part 37 causes the combination valve 18A in the normal-pressure gas-discharging system 12 to open, and controls the same based on the pressure detected by the pressure sensor 17 that is provided for the operation under a normal pressure. In addition, for an operation under a reduced pressure, the controlling part 37 causes the combination valve 18B in the reduced-pressure gas-discharging system 21 to open, and controls the same based on the pressure detected by the pressure sensor 26 or 27 that is provided for the operation under a reduced pressure. That is, two control systems can be achieved.

The oxidation treatment unit consisting of the above compositions has a leak-tight structure in which the gas can be discharged at a highly reduced pressure. For example, sealing means such as an O-shaped ring is provided at each connecting part in the gas-discharging system from the processing furnace 1. In addition, the thermal processing unit is adapted to automatically carry out a desired thermal processing method, by controlling the burning unit 8, the heater 6 and the controlling part 37 for the combination valves 18A and 18B through a controlling unit (not shown) in which a program recipe for the desired thermal processing method has been inputted in advance. In addition, an air-pressure-control type of valve 38 is provided in the drain pipe 14 at an upstream portion with respect to the trap 15.

Next, an operation of the above oxidation treatment unit (a thermal processing method) is explained. At first, the inside of the processing furnace 1 is open to the atmosphere, and is heated and controlled at a predetermined temperature such as 300° C. by the heater 6. The wafer boat 4 holding many semiconductor wafers W is loaded into the processing furnace 1. The furnace opening of the processing furnace 1 is hermetically closed by the lid 3. After that, the pressure in the processing furnace 1 is reduced by a vacuuming operation of the reduced-pressure gas-discharging system 21. Preferably, the pressure-reducing or vacuuming operation includes a cycle-purging step. During the loading step and the cycle-purging step, an inert gas such as $N_2$ is supplied into the processing furnace 1 in order to prevent that a natural oxidation film is formed on surfaces of the semiconductor wafers W. On the other hand, if the $N_2$ is 100%, the surfaces of the semiconductor wafers w may be nitrified. The nitrified surfaces are difficult to be oxidized at a subsequent oxidizing step. Thus, a small amount of oxygen, for example about 1% of oxygen is supplied during the loading step and the cycle-purging step.

The cycle-purging step is carried out by repeating supply and stop of the inert gas such as $N_2$ by turns while the inside of the processing furnace 1 is vacuumed. In the case, the gas-discharging system is switched into the reduced-pressure gas-discharging system 20 by means of the combination valve 18B. In addition, while the vacuum pump 22 is in operation, a pressure (a pressure in the tube 11= a pressure in the furnace 1) is detected by the pressure sensor 26. In addition, gas in the processing furnace 1 is discharged through a control of the combination valve 18B in such a manner that a pressure in the processing furnace 1 becomes a predetermined pressure such as about −1 Pa. In the reduced-pressure gas-discharging condition, an inert gas such as $N_2$, whose flow rate is controlled at a predetermined rate, is intermittently supplied by repeating opening and shutting an inert-gas-supplying valve (not shown). Thus, the cycle-purging step is carried out, the pressure in the processing furnace 1 is rapidly reduced, and the gas in the processing furnace 1 is replaced with the inert gas sufficiently. That is, rapid reduction of the pressure (shortening of a time until a predetermined vacuum is created) and gas-replacement can be achieved by the cycle-purging step.

Next, in the above reduced-pressure gas-discharging condition, the atmosphere in the processing furnace 1 is heated to a predetermined process temperature such as 850° C. via a control of the heater 6. As the gas-discharging system is switched into the normal-pressure gas-discharging system 12 by means of the combination valve 18A, the pressure in the processing furnace 1 is controlled at a slightly differential pressure, for example of −50 Pa to −100 Pa with respect to the atmospheric pressure. In the state, a recovery step (a step for stabilizing semiconductor-wafer temperature) is carried out, and then a predetermined heating process such as an HCl oxidation treatment is carried out. The heating treatment is carried out under a slightly reduced pressure, by supplying oxygen gas $O_2$ and hydrogen gas $H_2$ into the burning unit 8 to cause them to burn, and by supplying water vapor generated in the burning unit 8 into the processing furnace 1 together with hydrogen chloride gas HCl and an inert gas such as $N_2$.

After the heating processing step is completed, the gas-discharging system is switched into the reduced-pressure gas-discharging system 21 (automatic switching), so that the inside of the processing furnace 1 is vacuumed again to reduce the pressure therein. After that, through a control of the heater 6, a temperature of the inside of the processing furnace 1 is reduced to a predetermined temperature such as about 300° C. At the same time, the pressure in the processing furnace 1 is returned to a normal pressure, the wafer boat 4 is unloaded from the processing furnace 1, and a cooling step (wherein the semiconductor wafers are cooled to a conveyable temperature) is carried out. Preferably, the second pressure-reducing and vacuuming operation after completing the heating processing step also includes a cycle-purging step.

As described above, the semiconductor wafers W are contained in the processing furnace 1 that have been already heated to a predetermined temperature, the inside atmosphere in the processing furnace 1 is heated to a predetermined process temperature, and water vapor as a process gas is supplied in order to thermally process the semiconductor wafers W, wherein the heating step of the inside atmosphere is carried out under a reduced pressure. Thus, the semiconductor wafers W can be heated to the predetermined process temperature under a condition wherein oxidation species are excluded. Thus, it can be prevented that a natural oxidation film is formed during the heating step, so that a very-thin oxidation film whose quality is excellent can be formed.

In addition, not only before the predetermined heat treatment step but also after the same step, the inside in the processing furnace 1 is vacuumed to reduce the pressure therein. Thus, surplus oxidation species are sufficiently excluded except for in the desired heat treatment step, so that it can be sufficiently prevented that a natural oxidation film is formed. Thus, a very-thin oxidation film whose thickness is uniform and whose quality is uniform and excellent can be formed. For example, an $SiO_2$ film whose thickness is for example about 2 nm can be formed.

If the step of reducing the pressure in the processing furnace 1 or of vacuuming the processing furnace 1 includes what is called a cycle-purging step, rapid pressure-reduction and gas-replacement can be achieved, which can improve throughput.

In addition, the heat treatment unit comprises: the burning unit 8 that is water vapor supplying means for supplying the water vapor into the processing furnace 1; the normal-pressure gas-discharging system 12 that discharges the gas from the processing furnace 1 during the heat treatment step under a minute differential pressure or a minute reduced pressure; and the reduced-pressure gas-discharging system 21 that can vacuum the inside of the processing furnace 1 before and after the heat treatment step; wherein the switching operation between the normal-pressure gas-discharging system 12 and the reduced-pressure gas-discharging system 21 are carried out by means of the combination valves 18A and 18B. Thus, the above thermal processing method can be carried out surely and easily.

In the case, the burning unit 8 is formed to be able to supply the water vapor at a minute flow rate. Thus, if a sufficient film-forming time is taken, a very-thin oxidation film whose quality is more excellent can be formed. In addition, since the combination valves 18A and 18B have an opening-and-shutting function and a pressure-adjusting function, the number of valves can be reduced, so that structures of the normal-pressure gas-discharging system 12 and the reduced-pressure gas-discharging system 21 can be simplified, which can lead to reduction of costs.

In addition, as an oxidation treatment method, a diffusion treatment can be carried out by supplying nitrogen oxide gas NO or dinitrogen oxide gas $N_2O$ under a condition wherein the pressure in the processing furnace 1 is reduced and controlled to a predetermined pressure such as about 133 hPa, after a desired oxidation treatment step. Before and after the diffusion processing step, the inside of the processing furnace 1 is preferably vacuumed to reduce the pressure therein. In addition, preferably, the pressure-reducing and vacuuming operation includes a cycle-purging step. As described above, if the water component in the processing furnace is sufficiently removed by the cycle-purging step after the wet-oxidation treatment and then the nitrogen oxide gas NO or the dinitrogen oxide gas $N_2O$ are supplied, it can be sufficiently prevented that nitric acid $HNO_3$ with strong corrosiveness is generated. In addition, an SiON film having high insulation resistance can be formed, that is, improvement to a more reliable film-quality can be easily achieved.

Thus, the reduced-pressure type of oxidation treatment unit, by which a treatment can be carried out under a reduced pressure, is for supplying the process gas into the processing furnace 1 that contains the semiconductor wafers W and for thermally processing the semiconductor wafers W at a predetermined process temperature. Then, the reduced-pressure type of oxidation treatment unit has: the normal-pressure gas-discharging system 12 for discharging the gas from the processing furnace 1 at a predetermined discharging-pressure; the reduced-pressure gas-discharging system 21 for discharging the gas from the processing furnace 1 at another discharging-pressure lower than that by the normal-pressure gas-discharging system 12; the combination valves 18A and 18B provided in the normal-pressure gas-discharging system 12 and the reduced-pressure gas-discharging system 21, respectively, and adjustably caused to open and close, the pressures of the valves being also adjustable; the differential-pressure type or absolute-pressure type of pressure sensors 17, 26, 27 that detect the discharging-pressure; and the controller 35 that controls the combination valves 18A and 18B based on the pressures detected by the pressure sensors 17, 26, 27. Thus, a stable control can be achieved without necessity of introducing atmospheric air or introducing any inert gas. In addition, any switching valve is unnecessary, the structure of the gas-discharging system is simplified, and running-costs for the inert gas such as $N_2$ becomes unnecessary, so that reduction of costs for the whole unit is achieved.

Especially, if an absolute-pressure type of pressure sensor is used as the pressure sensor 17 in the normal-pressure gas-discharging system 12, a stable absolute-pressure control can be achieved in a vicinity of the atmospheric pressure, without disturbance caused by change in the atmospheric pressure based on the meteorological condition. Thus, an oxide film having a uniform film-thickness can be formed at any time.

Figure 3:
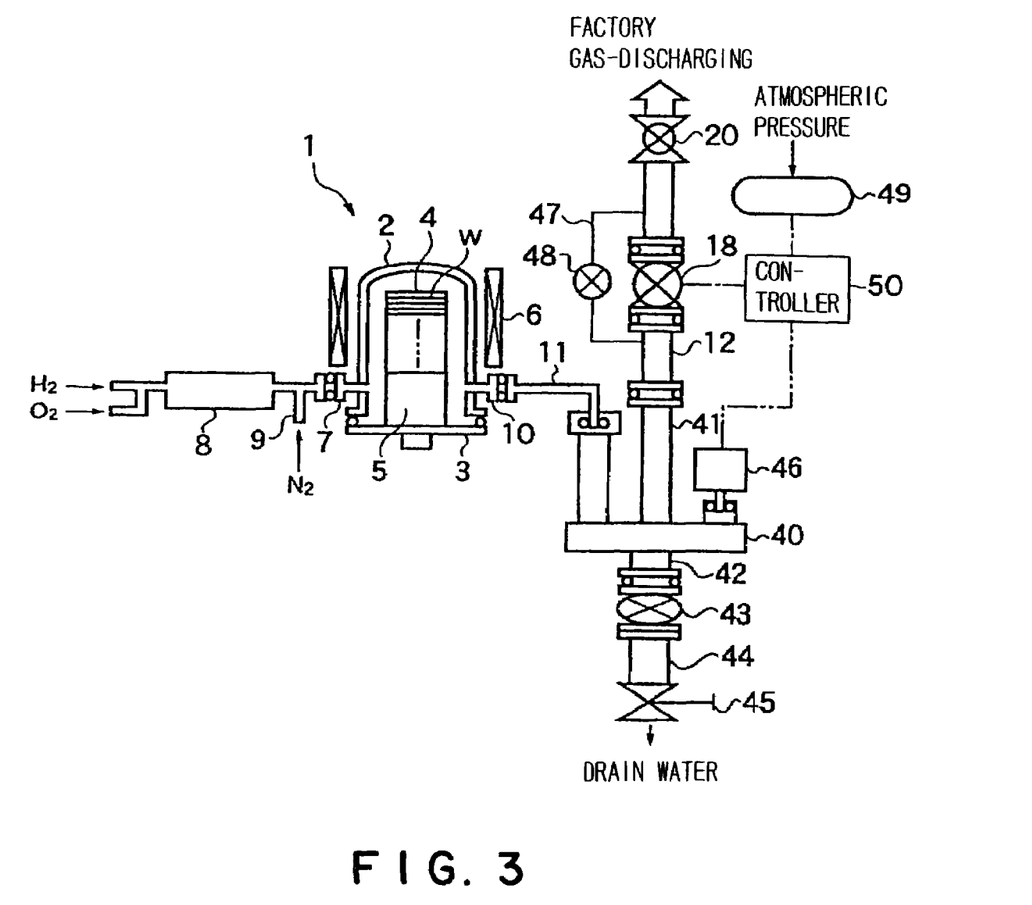
FIG. 3 is a structural view showing an oxidation treatment unit of a third embodiment according to the invention.

FIG. 3 is a view showing a structure of an oxidation treatment unit of a third embodiment according to the invention. The oxidation treatment unit (a thermal processing unit) of the embodiment is formed as a normal-pressure type of unit, similarly to the first embodiment. In the third embodiment, the same numeral references correspond to the same parts as the first embodiment. The explanation of the same parts is omitted.

In the oxidation treatment unit of the embodiment, in order to discharge drain water that is generated by the discharged water vapor being caused to condense, a duct 40 made of for example PTFE is connected to the gas-discharging part 10 of the reaction tube 2 via the gas-discharging pipe 11 made of for example quartz. The normal-pressure gas-discharging system 12 is connected to the duct 40 via a water-cooling type of condensation-pipe 41 that extends upward from the duct 40. The normal-pressure gas-discharging system 12 is connected to a gas-discharging duct of a factory gas-discharging system. The discharging-pressure of the factory gas-discharging system may be a minutely reduced pressure, for example about −1000 Pa [−7.5 Torr] as a differential pressure with respect to the atmospheric pressure. An assistance gas-discharging system that can reduce the differential pressure to about minus several thousand Pa [minus several dozen Torr] may be connected to the normal-pressure gas-discharging system 12 via a switching valve.

A drain pipe 42 that extends downward is connected to the duct 40. The drain pipe 42 is provided with an air-pressure-control type of valve 43, a trap 44 and a manual valve 45 in order. In addition, the duct 40 is provided with a differential-pressure type of pressure sensor 46 that is a differential-pressure gauge for detecting the discharging-pressure of the normal-pressure gas-discharging system 12 as a differential pressure with respect to the atmospheric pressure. As the differential-pressure type of pressure sensor 46, a pressure sensor that can detect a pressure within a range of atmospheric pressure ±6650 Pa (atmospheric pressure ±50 Torr) may be used.

A combination valve 18, which is adjustably caused to open and close and whose pressure is also adjustable, is provided in the normal-pressure gas-discharging system 12. In addition, a bypass pipe 47 that bypasses the combination valve 18 is connected to the normal-pressure gas-discharging system 12. The bypass pipe 47 is provided with a bypass valve 48, which is usually closed. The bypass valve 48 is caused to open when the combination valve 18 is automatically closed by a power failure or the like, in order to discharge the inert gas such as $N_2$ gas introduced into the reaction tube 2. In addition, the oxidation treatment unit of the embodiment uses sealing members such as O-shaped rings at pipe connections of the gas-introducing system and the gas-discharging systems and/or at a lid sealing portion of the processing furnace. Thus, an airtight structure preventing leakage can be achieved. That is, not only a normal-pressure treatment around the atmospheric pressure but also a reduced-pressure treatment or a positive-pressure treatment can be conducted without any leakage.

In addition, the oxidation treatment unit of the embodiment comprises: an absolute-pressure type of pressure sensor 49 that is an absolute-pressure gauge for detecting an atmospheric pressure as an absolute pressure; and a controlling part 50 that controls the combination valve 18 based on the pressure detected by the differential-pressure type of pressure sensor 46 in such a manner that the discharging-pressure in the normal-pressure gas-discharging system 12 coincides with a set differential pressure (a set pressure), and that amends the set differential pressure based on the pressure detected by the absolute-pressure type of pressure sensor 49.

As the absolute-pressure type of pressure sensor 49, for example, a general pressure sensor that can detect a pressure within a range of 0 to 1330 hPa (0 to 1000 Torr) may be used. Alternatively, as the absolute-pressure type of pressure sensor 49, for example, a pressure sensor that can detect a pressure within a range of 800 to 1100 hPa may be used.

For example, when an average atmospheric pressure where the oxidation treatment unit is installed is 1013.25 hPa (760 Torr) and a process pressure (a set pressure) is also 1013.25 hPa (760 Torr), that is, a set differential pressure is 0 Pa (0 Torr), if there is no change in the atmospheric pressure, the combination valve 18 is controlled by the controlling part 50, based on the pressure detected by the differential-pressure type of pressure sensor 46, in such a manner that the discharging-pressure in the normal-pressure gas-discharging system 12 coincides with the set differential pressure 0 Pa.

However, if the atmospheric pressure is changed to 997.5 hPa (750 Torr) because of a change in the weather, for example, because of approach of a cyclone, the discharging-pressure in the normal-pressure gas-discharging system 12 might be controlled to coincide with 997.5 hPa (750 Torr) through the control only by means of the differential-pressure type of pressure sensor 46, because the set differential pressure is 0 Pa (0 Torr). In that case, the film-thickness of an oxidation film that is formed on the surface of a semiconductor wafer may be changed.

Thus, the atmospheric pressure at that time 997.5 hPa (750 Torr) is detected by the absolute-pressure type of pressure sensor 49, the detected signal is inputted into the controlling part 50, and the set differential pressure 0 Pa (0 Torr) is amended to +15.75 hPa (+11.84 Torr). Accordingly, the discharging-pressure in the normal-pressure gas-discharging system 12 can be controlled to coincide with 1013.25 hPa (760 Torr). That is, since a set differential pressure when setting (a set pressure—an atmospheric pressure when setting) can be amended to a differential pressure at that time (the set pressure—an atmospheric pressure at that time), the discharging-pressure in the normal-pressure gas-discharging system 12 i.e. the process pressure in the processing furnace 1 can be always maintained at a fixed level, regardless of any change in the weather i.e. regardless of any change in the atmospheric pressure. Thus, the film-thickness of an oxidation film can be made uniform.

The above oxidation treatment unit is for supplying the process gas into the processing furnace 1 that contains the semiconductor wafers W and for thermally processing the semiconductor wafers W at a predetermined process temperature. Then, the normal-pressure type of oxidation treatment unit has: the normal-pressure gas-discharging system 12 for discharging the gas from the processing furnace 1 at a predetermined discharging-pressure; the combination valve 18 provided in the normal-pressure gas-discharging system 12 and adjustably caused to open and close, the pressure of the valve 18 being also adjustable; the differential-pressure type of pressure sensor 46 that detects the discharging-pressure as a differential pressure with respect to the atmospheric pressure; the absolute-pressure type of pressure sensor 49 that detects the atmospheric pressure as an absolute pressure; and the controller 50 that controls the combination valve 18 based on the pressure detected by the differential-pressure type of pressure sensor 46 in such a manner that the discharging-pressure in the normal-pressure gas-discharging system 12 coincides with a set differential pressure, and that amends the set differential pressure based on the pressure detected by the absolute-pressure type of pressure sensor 49. Thus, the signal from the absolute-pressure type of pressure sensor 49 that always monitors the atmospheric pressure is inputted into the controller 50, and the set pressure (the set differential pressure) is adjusted in accordance with the change in the atmospheric pressure, so that the process can be conducted always under a constant pressure. Thus, even by a differential-pressure control, regardless of any change in the atmospheric pressure (weather), a stable control can be achieved so that an oxidation film having a uniform film-thickness can be formed at any time. In addition, a stable control can be achieved without necessity of introducing atmospheric air or introducing any inert gas, differently from the conventional normal-pressure type of thermal processing unit. In addition, the structure of the gas-discharging system is simplified, and running-costs for the inert gas such as $N_2$ becomes unnecessary, so that reduction of costs for the whole unit is achieved.

As described above, the embodiments of the invention were explained in detail with reference to the drawings. However, this invention is not limited to the above embodiments, but may be changed or modified variously within a scope not away from the point of the invention. For example, in the above embodiments, the processing furnace is a vertical furnace, but could be a horizontal furnace. In addition, the processing furnace is a batch-type furnace, but could be a single-type furnace.

An object to be processed is not limited to the semiconductor wafer, but could be an LCD substrate or a glass substrate.

The water-vapor supplying means is not limited to burning-type means, but could be carburetor-type means, catalytic-type means or boiling-type means.

In addition, in the embodiments, the invention is applied to the oxidation treatment units. However, the invention is applicable to a diffusion treatment unit, a CVD treatment unit, an annealing unit, and so on, in addition to the oxidation treatment unit.

What is claimed is:

1. A thermal processing unit comprising:
   a processing furnace,
   gas-supplying means that supplies a process gas into the processing furnace,
   heating means that heats an inside of the processing furnace to a predetermined process-temperature,
   a normal-pressure gas-discharging system for discharging gas from the processing furnace at a predetermined discharging-pressure that is near to an atmospheric pressure, a first valve provided in the normal-pressure gas-discharging system, the valve being adjustably caused to open and close, a pressure of the gas through the valve being also adjustable, the first valve being able to hermetically shut off, a first pressure sensor that detects a discharging-pressure in the normal-pressure gas-discharging system, a reduced-pressure gas-discharging system for discharging gas from the processing furnace at another predetermined discharging-pressure that is lower than the atmospheric pressure, a second valve provided in the reduced-pressure gas-discharging system, the valve being adjustably caused to open and close, a pressure of the gas through the valve being also adjustable, the second valve being able to hermetically shut off, a second pressure sensor that detects a discharging-pressure in the reduced-pressure gas-discharging system, and a controller that controls the first valve based on the pressure detected by the first pressure sensor and that controls the second valve based on the pressure detected by the second pressure sensor, the normal-pressure gas-discharging system has a bypass pipe that connects to said normal-pressure gas-discharging system at a first position and at a second position along the normal-pressure gas-discharging system and thereby bypasses the first valve thereof, said reduced-pressure gas-discharging system connects to the said normal-pressure gas-discharging system at a position that is between the first position and the second position, and the bypass pipe is provided with a bypass valve and a check valve, and the bypass pipe bypasses a portion of the normal-pressure gas-discharging system located between the first position and the second position, and bypasses the reduced-pressure gas-discharging system.

* * * * *